United States Patent [19]

Barbour

[11] Patent Number: 4,990,868
[45] Date of Patent: Feb. 5, 1991

[54] MODIFIED PROGRESSIVE IMPEDANCE LADDER NETWORK

[75] Inventor: Dan Barbour, Woodridge, Ill.

[73] Assignee: Rockwell International Corporation, El Segundo, Calif.

[21] Appl. No.: 405,089

[22] Filed: Sep. 6, 1989

Related U.S. Application Data

[63] Continuation of Ser. No. 287,612, Dec. 10, 1988, abandoned, which is a continuation of Ser. No. 129,410, Nov. 25, 1987, abandoned, which is a continuation of Ser. No. 835,701, Mar. 3, 1986, abandoned.

[51] Int. Cl.$^5$ .............................................. H03H 7/24
[52] U.S. Cl. .................................. 333/81 R; 330/51; 307/540
[58] Field of Search ............. 333/81 R, 81 A; 330/51; 307/540, 547, 598, 530, 567, 568

[56] References Cited

U.S. PATENT DOCUMENTS

| | | | |
|---|---|---|---|
| 3,370,181 | 2/1968 | Sitomer | 333/81 R X |
| 4,132,957 | 1/1979 | Hekimian et al. | 330/51 |
| 4,138,637 | 2/1979 | Weinert | 333/81 R X |
| 4,354,159 | 10/1982 | Schorr et al. | 333/81 R X |
| 4,438,408 | 3/1984 | Skrovanek et al. | 333/81 R X |
| 4,442,325 | 4/1984 | McDermott | 333/81 A X |
| 4,467,286 | 8/1984 | Stitt | 333/81 R X |
| 4,468,607 | 8/1984 | Tanaka et al. | 333/81 R X |
| 4,654,610 | 3/1987 | DaSilva | 333/81 R |
| 4,683,386 | 7/1987 | Kamikawa | 333/81 R X |

FOREIGN PATENT DOCUMENTS

| | | | |
|---|---|---|---|
| 0082521 | 6/1980 | Japan | 333/81 R |
| 0055606 | 4/1982 | Japan | 333/81 R |
| 1375030 | 11/1974 | United Kingdom | 330/51 |

Primary Examiner—Benny Lee
Attorney, Agent, or Firm—C. B. Patti; V. L. Sewell; H. F. Hamann

[57] ABSTRACT

A modified progressive impedance ladder network has a plurality of cascaded resistive sections. Each of these sectiions has at least one resistive element and a single switch with values selected such that the section input impedance is larger than the output impedance of the preceding section.

1 Claim, 2 Drawing Sheets

MODIFIED PROGRESSIVE IMPEDANCE LADDER NETWORK

This is a continuation of Ser. No. 287,612 filed Dec. 10, 1988 and now abandoned, which is a continuation of Ser. No. 129,410 filed Nov. 25, 1987 and now abandoned, which is a continuation of Ser. No. 835,701 filed Mar. 3, 1986 and now abandoned.

BACKGROUND OF THE INVENTION

The invention pertains in general to impedance ladder networks or attenuators and, in particular, to a multiplicity of switchably activated resistance elements couPled together to form a network having selectable attenuation settings. Such attenuator networks which have precision graduated settings are commonly known as prescription attenuators.

Prescription attenuators find a variety of uses in the instrumentation field to establish precision voltage references and in the telecommunication field where, for instance, amplifiers are configured with prescription attenuation feedback networks to produce selectable gains for compensating the loss due to various telephone line lengths. In this manner, a single amplifier unit having a plurality of switchable gain settings may be utilized to match any one of a plurality of lines. In addition, if the line characteristics change because of replacement or degradation, a craftsman need only to select a new amplification setting rather than experiment with the gain of the amplifier to arrive at a proper level.

Prescription attenuators used in conjunction with amplifiers typically provide for manually setting the amplifier amplification by way of switches mounted in the amplifier front panel. The switches, traditionally of the double-pole type, connect sections of a constant resistance T-pad between the amplifier input and output to provide amplifier gains in proportion to the attenuation of the activated sections. T-pad attenuators, having three resistive components, are well known in the art. A plurality of T-pads are generally cascaded and the resistive components so chosen so that each T-pad section may be switchably connected into the feedback path. An overall amplifier gain results which is the product (db sum) of the gains attributable to each individually activated section.

The versatility of a prescription gain amplifier is enhanced in view that a craftsman may select any permutation of switch settings to obtain a desired gain. When utilized with T-pad sections, this added versatility is not without the attendant disadvantage of having to extend at least three wires per double-pole switch to the module faceplate or facade where the switches are physically located.

In a typical 24 db gain amplifier having 0.1 db resolution, the number of interconnections for eight switches will normally be twenty-five but may range as high as thirty-two (depending on the number of common connections as will be discussed below).

Recognizing the cost, labor and materials involved, attempts have been made to obviate the multiple interconnection disadvantage by locating the attenuator components on the faceplate. While this measure alleviates some of the problems, other difficulties, such as trouble shooting defective circuitry, arises out of this attempted solution.

The T-pad network configuration, when used in conjunction with amplifiers to produce prescription gain does exhibit a constant input and output impedance, but such a configuration has the offsetting disadvantage of producing a 6 db gain when all sections are in the nonactivated state. To overcome this aspect, additional loss is inserted either before or after the amplifier stage.

Accordingly, in attenuator networks, it would be highly desirable to substantially reduce the number of inter-connections and the number of attenuator components (and thus cost), yet combine the feature of faceplate-mounted switches wired to the components located on the module board.

In U.S. Pat. No. 4,354,159 a progressive impedance ladder network is disclosed in which a multiple section L-pad attenuator is provided having switchably activated sections. When connected to a source voltage each L-pad section feeds a portion of the voltage to subsequent activated sections thereby providing attenuation. The various section resistive components are selected to produce an ascending inter-section ratio to minimize interference between sections in addition to achieving a desired mixture of individual section attenuations. Importantly, the L-pad sections are individually activated by a single-pole type switch to thereby minimize the number of switches and the switch-to-resistor wire connections.

The attenuator arrangement is utilized as a feedback network with an operational amplifier to provide prescription gain settings. The amplifier output voltage is fed back to its inverting input attenuated by an amount which is dependent upon the attenuator switch settings.

The present invention is an improved and modified version of this progressive network.

OBJECTS OF THE INVENTION

It is a general object of the present invention to provide an improved, progressive impedance ladder network.

It is another object of the present invention to provide a network having a minimum number of switch connections and which is economical to manufacture.

It is a further object of the present invention to modify the progressive impedance ladder network so that all input and output connections are common with a switch connection, thus providing the minimum possible number of switch connections.

SUMMARY OF THE INVENTION

The present invention is a modified progressive impedance ladder network which has a plurality of cascaded resistive sections. Each of the sections has at least one resistive element and a single switch with values selected such that the section input impedance is larger than the output impedance of the preceding section. This is achieved through the use of a uniquely configured switching arrangement.

BRIEF DESCRIPTION OF THE DRAWINGS

The features of the present invention which are believed to be novel are set forth with particularity in the appended claims. The invention together with further objects an advantages may best be understood by reference to the following description taken in conjunction with accompanying drawings, in the several figures of which like reference numerals identify like elements, and in which:

DESCRIPTION OF THE PREFERRED EMBODIMENT

The present invention is an improved circuit of the type disclosed in U.S. Pat. No. 4,354,159. This prior art circuit is a prescription attenuator which has a plurality of cascaded L-pad sections coupled together to form an attenuator network.

Figure 1:
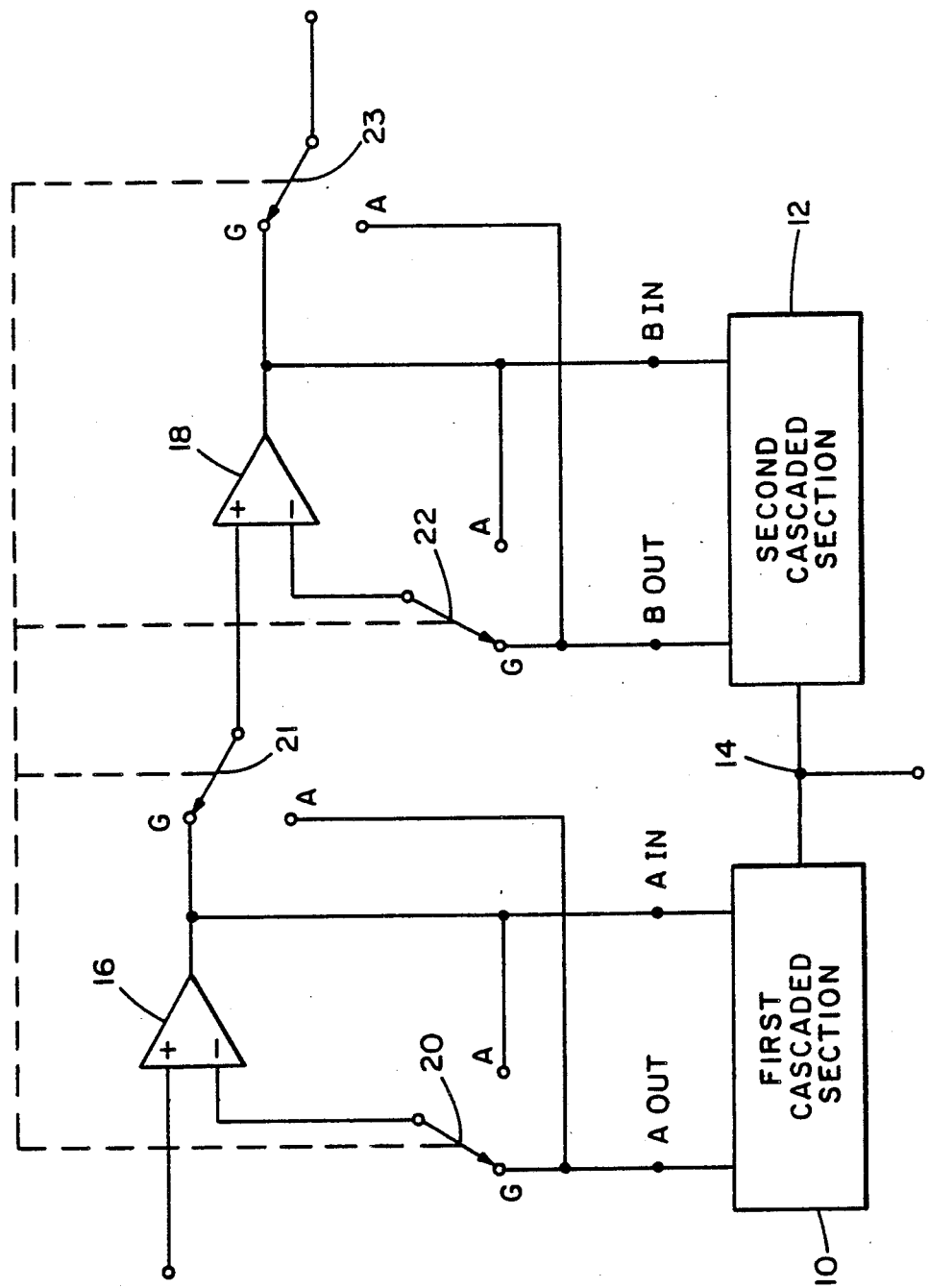
FIG. 1 is a block diagram of the improved, progressive impedance ladder network of the present invention.

Each of the cascaded sections includes a single pole switch for activating its respective section. The network impedance values are selected so that single L-pad section activations produce actual attenuations slightly different than an ideal level of attenuation wherein multiple section activations tend to keep the error evenly distributed around the ideal level of attenuation. Although the network is actually an attenuator, when it is placed in the feedback loop of an amplifier, such as shown in FIG. 1, gain is produced from the amplifier. Using the prior art network, the error due to the interaction of the L-pads is always such that the gain due to adding two stages is less than the sum of the two stages individually. In the present invention, because some of the switches short out a feedback resistor and some add in a shunt resistor, some of the errors are negative and some of the errors are positive. This provides a near uniform distribution of errors around the ideal value with some of the values being achieved with no error. Additionally, the prior art requires separate input and output connections to the network where the new design has all input and output connections common with switch connections. Thus the present invention is an improvement over the prior art network.

As shown in FIG. 1, the network of the present invention may be illustrated as comprising two blocks, 10 and 12, which are a first and second cascade section, respectively. The first block 10 has an input AIN and an output AOUT. The second block 12 has an input Bin and an output BOUT. Blocks 10 and 12 have a common connection 14. When the network blocks 10 and 12 are connected to operational amplifiers 16 and 18 as shown in FIG. 1, the FIG. 1 circuit produces gain when the switches 20, 21, 22 and 23 are in the position shown as G and produces attenuation when the switches 20, 21, 22 and 23 are in the position shown as A. Operation of this overall gain/attenuation circuit is described in U.S. Pat. No. 4,354,159.

Figure 2:
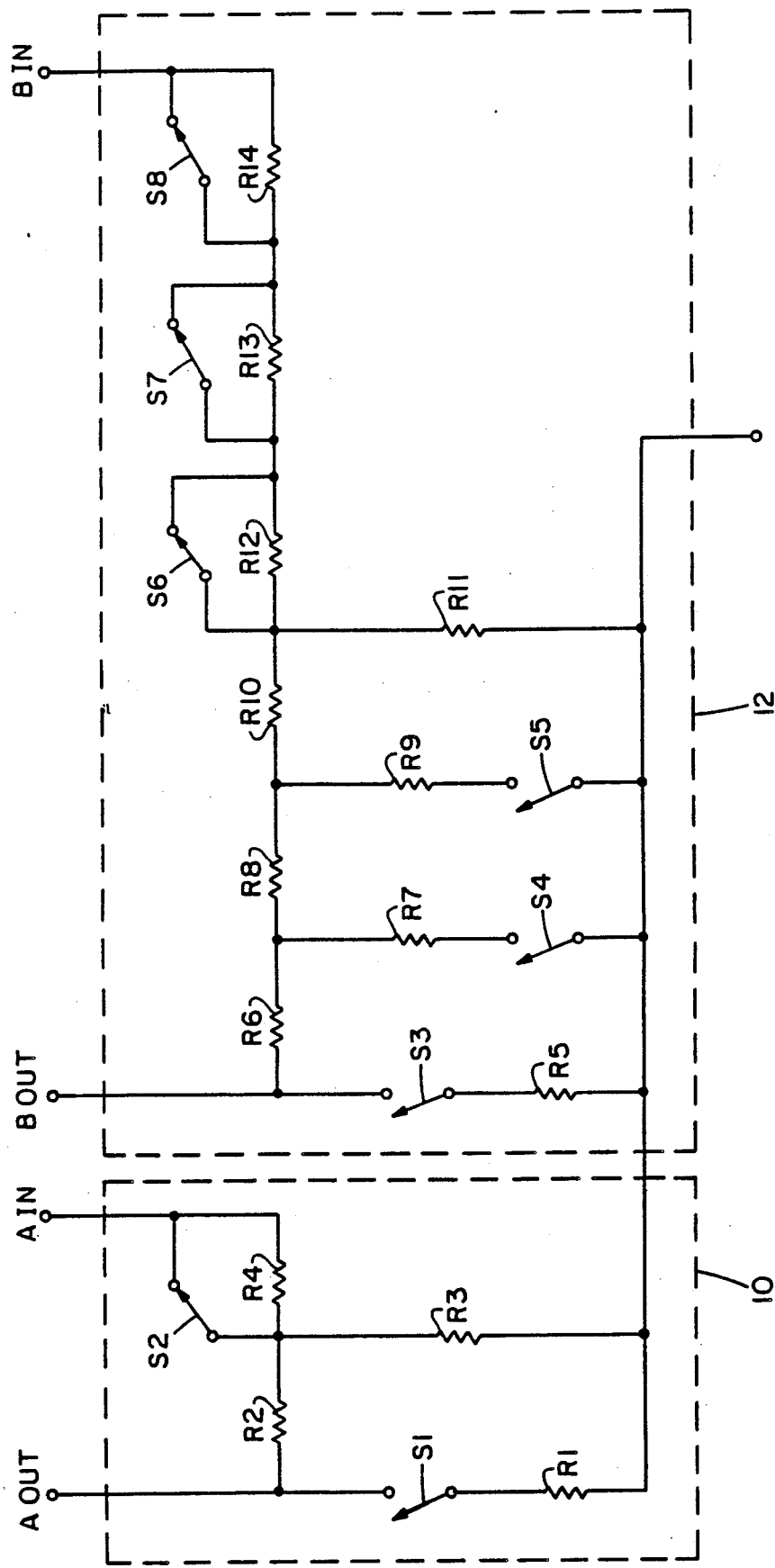
FIG. 2 is a circuit diagram of two of the blocks in the FIG. 1 block diagram.

The circuit contained in blocks 10 and 12 is shown in detail in FIG. 2. A first switch S1 connects shunt resistor R1 to the output terminal AOUT. A second switch S2 shorts out a feedback resistor R4 which is connected to the input terminal AIN. Resistors R2 and R3 complete the circuit in block 10 as shown in FIG. 2.

In block 12, a third switch S3 connects a shunt resistor R5 to the output terminal BOUT. Switches S4 and S5 connect shunt resistors R7 and R9 to the circuitry as shown in FIG. 2. Switches S6, S7 and S8, short out feedback resistors R12, R13, and R14, respectively. Resistors R6, R8, R10 and R11, complete the circuitry as shown in FIG. 2. Depending upon the setting of the switches, S1 through S8, various degrees of gain or attenuation can be achieved.

Section 10 produces up to 18 db of gain or attenuation in 6 db increments. When switch S1 is open and switch S2 is closed, the attenuation through the section is 0 db. When switch S2 is opened, resistor R4 is no longer shorted out and an L-pad attenuator is formed with resistors R4 and R3. The attenuation of this L-pad is 5.98 db. When switch S1 is closed, R1 is connected into the circuit and an L-pad with 11.98 db of attenuation is formed from resistors R2 and R1. When both L-pads are engaged, a total of 18.00 db is produced. This is an example of a positive error because the total is 0.04 db larger than the individual attenuations.

Section 12 produces up to 6 db of gain or attenuation in 0.1 db increments. When switches S3, S4 and S5 are opened and switches S6, S7 and S8 are turned on, 0 db attenuation is produced. For reference purposes, this will be the position of the switches unless otherwise stated. Opening S8 will produce 0.107 db of attenuation by forming an attenuator using R14 and R11. Closing on S5 will produce an attenuation of 0.196 db through resistors R10 and R9. Opening S7 will produce an attenuation of 0.427 db using resistors R13 and R11. If S7 and S8 are both opened, then an attenuation of 0.528 db is produced. This is an example of negative error because this total is 0.006 db smaller than the sum of the parts.

The other switches act in a similar fashion. The action of the positive and negative errors result in a distribution of errors from ideal values such that 129 values are above the ideal, 105 values are negative, and 3 are exact.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction should be interpreted as illustrative and not in a limiting sense.

What is claimed is:

1. A modified progressive impedance ladder network comprising:

a first group having a first group input and a first group output and a second group having a second group input and a second group output, and said first group connected to said second group via a common terminal;

said first group having a first resistive element connected between said common terminal and a terminal of a first switch, another terminal of said first switch connected to said first group output, a third resistive element connected between said common terminal and a terminal of a second switch, another terminal of said second switch connected to said first group input, second and fourth resistive elements connected in series between said first group input and said first group output, a juncture of said second and fourth resistive elements connected to a juncture of said third resistive element and said second switch;

said second group having a fifth resistive element connected between said common terminal and a terminal of a third switch, another terminal of said third switch connected to said second group output, sixth, eighth, tenth, twelfth, thirteenth and fourteenth resistive elements connected in series between said second group output and said second group input, a seventh resistive element connected in series with a fourth switch between said common terminal and a juncture of said sixth and eight resistive elements, a ninth resistive element connected in series with a fifth switch connected between said common terminal and a juncture of said eighth and tenth resistive elements, an eleventh resistive element connected between said common terminal and juncture of said tenth resistive element and twelfth resistive element, a sixth switch connected in parallel to said twelfth resistive element, a seventh switch connected in parallel to said thirteenth resistive element and an eight switch connected in parallel across said fourteenth resistive element; said second group input connected to a juncture of said eighth switch and said fourteenth resistive element opposed from a juncture of said thirteenth and fourteenth resistive elements.

* * * * *